United States Patent
Kuroki

(10) Patent No.: US 7,791,390 B2
(45) Date of Patent: Sep. 7, 2010

(54) PHASE SHIFTER

(75) Inventor: Reiko Kuroki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 55 days.

(21) Appl. No.: 11/768,427

(22) Filed: Jun. 26, 2007

(65) Prior Publication Data

US 2008/0001645 A1 Jan. 3, 2008

(30) Foreign Application Priority Data

Jun. 29, 2006 (JP) .............................. 2006-178930

(51) Int. Cl.
*H03K 5/13* (2006.01)
(52) U.S. Cl. .................. 327/231; 327/233; 327/115; 327/117
(58) Field of Classification Search ......... 327/113–117, 327/231, 233
See application file for complete search history.

(56) References Cited

U.S. PATENT DOCUMENTS 4,914,401 A * 4/1990 Mader ........................ 330/261
6,154,333 A * 11/2000 Narusawa et al. ............ 360/67
6,265,898 B1 * 7/2001 Bellaouar .................... 326/93
6,529,052 B2 * 3/2003 Wang ......................... 327/120
6,597,212 B1 * 7/2003 Wang et al. .................. 327/117
6,891,440 B2 * 5/2005 Straub et al. ................ 331/1 R
7,298,183 B2 * 11/2007 Mirzaei et al. ............... 327/115
2006/0202730 A1 * 9/2006 Murden et al. .............. 327/291

FOREIGN PATENT DOCUMENTS

| JP | 8-237077 A | 9/1996 |
| JP | 9-307414 A | 11/1997 |

* cited by examiner

*Primary Examiner*—An T Luu
(74) *Attorney, Agent, or Firm*—Sughrue Mion, PLLC

(57) ABSTRACT

A phase shifter according to an embodiment of the present invention includes: an AC component amplifying unit; and a dividing circuit. The AC component amplifying unit has positive gain slope characteristics and deforms a waveform of an input differential clock signal to output the deformed differential clock signal. The dividing circuit includes a T-flipflop having two D latches connected in series and receives the deformed differential clock signal defoemed by the AC component amplifying unit to generate at least two output signals having a phase difference of 90 degrees with a frequency of ½ of the deformed differential clock signal.

3 Claims, 15 Drawing Sheets

RELATED ART

RELATED ART

RELATED ART

PHASE SHIFTER

BACKGROUND OF THE INVENTION

1. Field of the Invention

The present invention relates to a phase shifter that divides a frequency of an input signal to generate output signals 90 degrees out of phase with each other.

2. Description of Related Art

FIG. 11 shows the configuration of a phase shifter of the related art A phase shifter 7 of FIG. 11 receives differential clock signals, more specifically, a clock signal CLK and an inverted clock signal CLKB complementary to the clock signal CLK, divides frequencies of the signals by 2, and outputs four signals having a phase difference of 90 degrees to terminals MQ, MQB, SQ and SQB.

A dividing circuit (dividing circuit) 70 of the phase shifter 7 is configured by a master-slave type flipflop (MS-FF) where a master D latch 71 and a slave D latch 72 are connected in series. Further, an inverting Q output ($Q_N$) of the slave D latch 72 is feedback-connected to a D input ($D_P$) of the master D latch 71, a clock signal CLK is input to a the G input ($G_P$) of the slave D latch 72, and an inverted clock signal CLKB is input to a the G input ($G_P$) of the master D latch 71. The thus-configured MS-FF operates as a T-flipflop where the Q output ($Q_P$) of the slave D latch 72 is inverted on the rising edge of the clock signal CLK. Thus, a divided signal having a frequency of ½ of the clock signal CLK is obtained at the Q output ($Q_P$) of the slave D latch 72. Further, on the falling edge of the clock signal CLK, the fed-back inverting Q output ($Q_N$) of the slave D latch 72 is obtained at the Q output ($Q_P$) of the master D latch 71.

Incidentally, the master D latch 71 and slave D latch 72 of FIG. 11 are generally configured as a differential circuit. FIG. 11 shows lines connected to the inverting D input (DN) and the inverting G input ($G_N$) of the master D latches 71 and slave D latch 72.

The thus-configured dividing circuit 70 can output signals having a phase difference of 90 degrees with a frequency of ½ of the clock signal CLK to the Q output ($Q_P$) of the master D latch 71 and the Q output ($Q_P$) of the slave D latch 72 if a duty ratio of the clock signal CLK is 50%. Thus, four signals to be output to the two Q outputs ($Q_P$) of the D latches 71 and 72 and corresponding inverting Q outputs ($Q_N$) are extracted at four terminals MQ, MQB, SQ and SQB, and then the phase shifter 7 can generate four signals having a phase difference of 90 degrees. In FIG. 11, a phase of an output signal at the terminal MQ for the Q output ($Q_P$) of the master D latch 71 is set to 0 degrees as a reference phase angle, and a phase of an output signal at the terminal MQB for the inverting Q output ($Q_N$) of the master D latch 71 is set to 180 degrees, a phase of an output signal at the terminal SQ for the Q output ($Q_P$) of the slave D latch 72 is set to 90 degrees, and a phase of an output signal at the terminal SQB for the inverting Q output ($Q_N$) of the slave D latch 72 is set to 270 degrees based on the reference phase angle.

As described above, the phase shifter 7 of FIG. 11 generates output signals having a phase difference of 90 degrees on the basis of the rising edge and falling edge of the clock signal CLK. Therefore, if a duty ratio of the clock signal CLK differs from 50%, a period from the rising edge to falling edge of the clock signal CLK does not match with a period from the falling edge to rising edge of the clock signal CLK, so a phase difference between output signals of the phase shifter 7 is not 90 degrees. For example, as indicated by a waveform (a) or (b) of FIG. 12, if a duty ratio of the clock signal CLK (as indicated by solid line) and the inverted clock signal CLKB (as indicated by broken line) differs from 50%, a phase difference between two signals output to the terminals MQ and SQ is no longer 90 degrees as indicated by waveforms (c) to (f) of FIG. 12. The same holds true of a phase difference between two signals output to the terminals MQB and SQB.

Incidentally, the waveform (a) of FIG. 12 is a signal waveform for the case where a duty ratio is deteriorated due to a difference between a time width $T_H$ in a High level period of the clock signal CLK (hereinafter referred to as "High-level width") and a time width $T_L$ in a Low level period (hereinafter referred to as "Low-level width"). On the other hand, the waveform (b) of FIG. 12 is a signal waveform for the case where a duty ratio is deteriorated due to DC offset components superimposed on at least one of the clock signal CLK and inverted clock signal CLKB. As for the waveform (b), a common voltage $V_{CM}$ level of the clock signals CLK and CLKB as a differential signals is changed due to the DC offset, with the result that the High-level width $T_H$ does not match with the Low-level width $T_L$ of the signals CLK and CLKB on the basis of the common voltage $V_{CM}$. As a result, duty ratios of the signals CLK and CLKB differ from 50%.

There has been hitherto proposed a phase shifter capable of keeping a phase difference between output signals to 90 degrees even in such cases that the duty ratio of the clock signal CLK differs from 50% (see Japanese Unexamined Patent Publication Application Nos. 9-307414 and 8-237077, for instance).

FIG. 13 shows an example of the configuration of a phase shifter 8 as disclosed in Japanese Unexamined Patent Publication Application No. 9-307414. In FIG. 13, the dividing circuit 80 is a master-slave type T-flipflop corresponding to the dividing circuit 70 of FIG. 11. To be specific, the circuit is configured by a CML (Current Mode Logic) circuit composed of NPN-type transistors Tr1, Tr2, and Tr5 to Tr12, resistors R1 to R6, and a constant current circuit 87. Incidentally, resistor R5 and R6 are loads 82 for monitoring a duty ratio of the clock signal CLK, which are provided to convert a collector current of the signal input transistors Tr1 and Tr2 to a voltage signal. The low-pass filter (LPF) 83 extracts DC components corresponding to a difference from the 50% duty ratio of the clock signal CLK from the voltage signal converted with the duty ratio monitoring load 82. The DC components output from the LPF 83 are amplified with the DC component amplifier 84 and fed-back to base terminals of the signal input transistors Tr1 and Tr2. Incidentally, the capacitors C1 and C2 are provided to cut DC components of the input clock signal CLK and inverted clock signal and suppress an influence of a current flowing from a circuit at the previous stage of the capacitor C1 and C2 to the base of the transistors Tr1 and Tr2 and an influence of a bias voltage applied with the DC component amplifier 84 on the previous circuit.

That is, a method of controlling a phase difference between output signals used in the phase shifter 8 as disclosed in Japanese Unexamined Patent Publication Application No. 9-307414 applies DC offset to the clock signals CLK and CLKB as differential signals with the DC component amplifier 84 to adjust duty ratios of the clock signals CLK and CLKB to 50%, and generates output signals with the dividing circuit 80 based on the rising edge and falling edge of the corrected clock signal to thereby set a phase difference between output signals to 90 degrees.

Similar to the phase shifter as disclosed in Japanese Unexamined Patent Publication Application No. 9-307414, the phase shifter as disclosed in Japanese Unexamined Patent Publication Application No. 8-237077 employs a method of applying DC offset to the clock signals CLK and CLKB as differential signals to previously adjust duty ratios of the clock signals CLK and CLKB to keep a phase difference between output signals to 90 degrees. To be specific, a phase comparator detects a shift of a phase difference between output signals from 90 degrees with the phase shifter, and DC offset corresponding to the detected phase shift is fed back to an input terminal of the phase shifter. With such configuration, the phase shifter as disclosed in Japanese Unexamined Patent Publication Application No. 8-237077 keeps a phase difference between output signals to 90 degrees.

The phase shifter as disclosed in Japanese Unexamined Patent Publication Application Nos. 9-307414 and 8-237077 can keep a phase difference between output signals to 90 degrees even if a duty ratio of the clock signal differs from 50%, in the case where an input clock signal is a sine or triangular wave signal. Further, if the clock signal CLK has a rectangular wave or trapezoid wave similar to the rectangular wave, and a duty ratio of the clock signal is reduced due to the DC offset as indicated by the waveform (b) of FIG. 12, a phase difference between output signals can be kept to 90 degrees. However, phase shifter as disclosed in Japanese Unexamined Patent Publication Application Nos. 9-307414 and 8-237077 cannot adjust a duty ratio of the clock signal to 50% due to the added DC offset nor to keep a phase difference between output signals to 90 degrees if the clock signal CLK has a rectangular wave or trapezoid wave similar to the rectangular wave, and a duty ratio of the clock signal differs from 50% due to a difference between the High-level width $T_H$ and Low-level width $T_L$ as indicated by the waveform (a) of FIG. 12.

Consider the case where a trapezoid waveform that sharply rises and falls as shown in FIG. 14A and the High-level width $T_H$ is wider than the Low-level width $T_L$ by way of example. Incidentally, $V_{CM}$ of FIG. 14A represents a common voltage of the clock signals CLK and CLKB as differential signals. FIG. 14B shows a waveform obtained by applying DC offset to the clock signals CLK and CLKB having such waveform with the DC component amplifier 84. As is understood from FIG. 14B, even if DC offset is applied to the clock signal having a trapezoid waveform or rectangular waveform that abrupt rises as shown in FIG. 14A, it is difficult to adjust the duty ratio to 50%.

As described above, the present inventor has recognized that the phase shifter as disclosed in Japanese Unexamined Patent Publication Application Nos. 9-307414 and 8-237077 does not ensure that output signals a phase difference between which is adjusted to 90 degrees can be obtained if a duty ratio of the input clock signal cannot be adjusted to 50%.

SUMMARY

In one embodiment, there is provided a phase shifter that includes: an AC component amplifying unit; and a dividing circuit. The AC component amplifying unit has positive gain slope characteristics and deforms a waveform of an input differential clock signal to output the deformed differential clock signal. The dividing circuit includes a T-flipflop having two D latches connected in series and receives the deformed differential clock signal deformed by the AC component amplifying unit to generate at least two output signals having a phase difference of 90 degrees with a frequency of ½ of the deformed differential clock signal.

Even if a duty ratio of the input differential clock signal differs from 50%, the AC component amplifying unit can change a waveform of the differential clock signal such that an attenuation quantity of a signal amplitude in a period with a long time length of the differential clock signal, that is, a period including more lower-frequency components than a period with a short time length is larger than an attenuation quantity of a signal amplitude in a period with a short time length of the differential clock signal. In other words, a signal amplitude in a period with a short time length of the differential clock signal is amplified more largely than a signal amplitude in a period with a long time length of the differential clock signal. Therefore, the differential clock signal deformed with the above AC component amplifying unit is input to the dividing circuit to thereby set a transition time difference between output signals of the two D latches constituting the dividing circuit, so a phase difference between output signals of the dividing circuit can be adjusted.

As a result, the differential clock signals, that is, clock signals CLK and CLKB have the waveform similar to the rectangular waveform as shown in of FIG. 14B, and the phase shifter of the present invention can adjust a phase difference between output signals to 90 degrees even if it is difficult to adjust a phase difference between output signals with the phase shifter 8 of the related art.

According to the embodiment of the present invention described above, it is possible to provide a phase shifter capable of generating output signals of having a phase difference of 90 degrees even if input differential clock signals have a waveform similar to a rectangular waveform, and a duty ratio differs from 50%.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Figure 1:
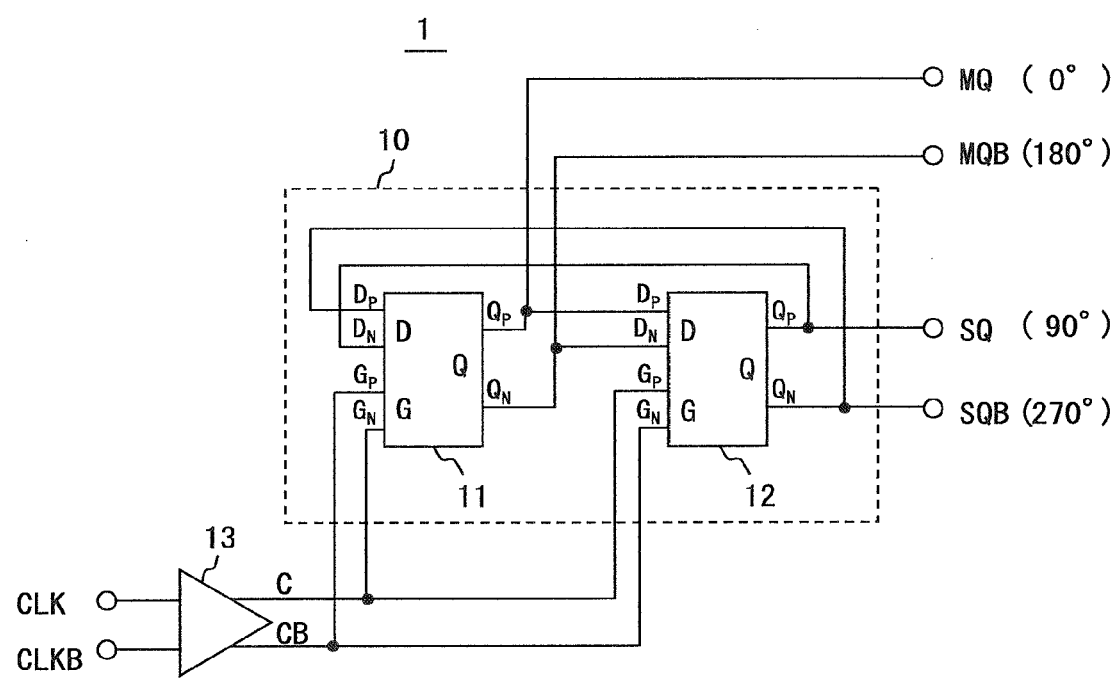
FIG. 1 is a diagram of a phase shifter according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described in detail with reference to the accompanying drawings. The same components are denoted by like reference numerals throughout the accompanying drawings, and repetitive description thereof is omitted here if not necessary.

First Embodiment

FIG. 1 shows the configuration of a phase shifter 1 of this embodiment. In FIG. 1, the dividing circuit 10 is a master-slave type T-flipflop where a master D latch 11 and a slave D latch 12 are connected in series. The basic configuration of the dividing circuit 10 is the same as that of the dividing circuit 70 of the phase shifter 70 of the related art. To be specific, an inverting Q output ($Q_N$) of the slave D latch 12 is feedback-connected to a D input ($D_P$) of the master D latch 11. Further, a clock signal C obtained by filtering the input clock signal CLK through a high-pass filter (HPF) 13 as described hereinafter is input to a the G input ($G_P$) of the slave D latch 12. On the other hand, an inverted clock signal CB obtained by filtering an inverting signal CLKB corresponding to the clock signal CLK through the HPF 13 is input to a the G input ($G_P$) of the master D latch 11.

Figure 3:
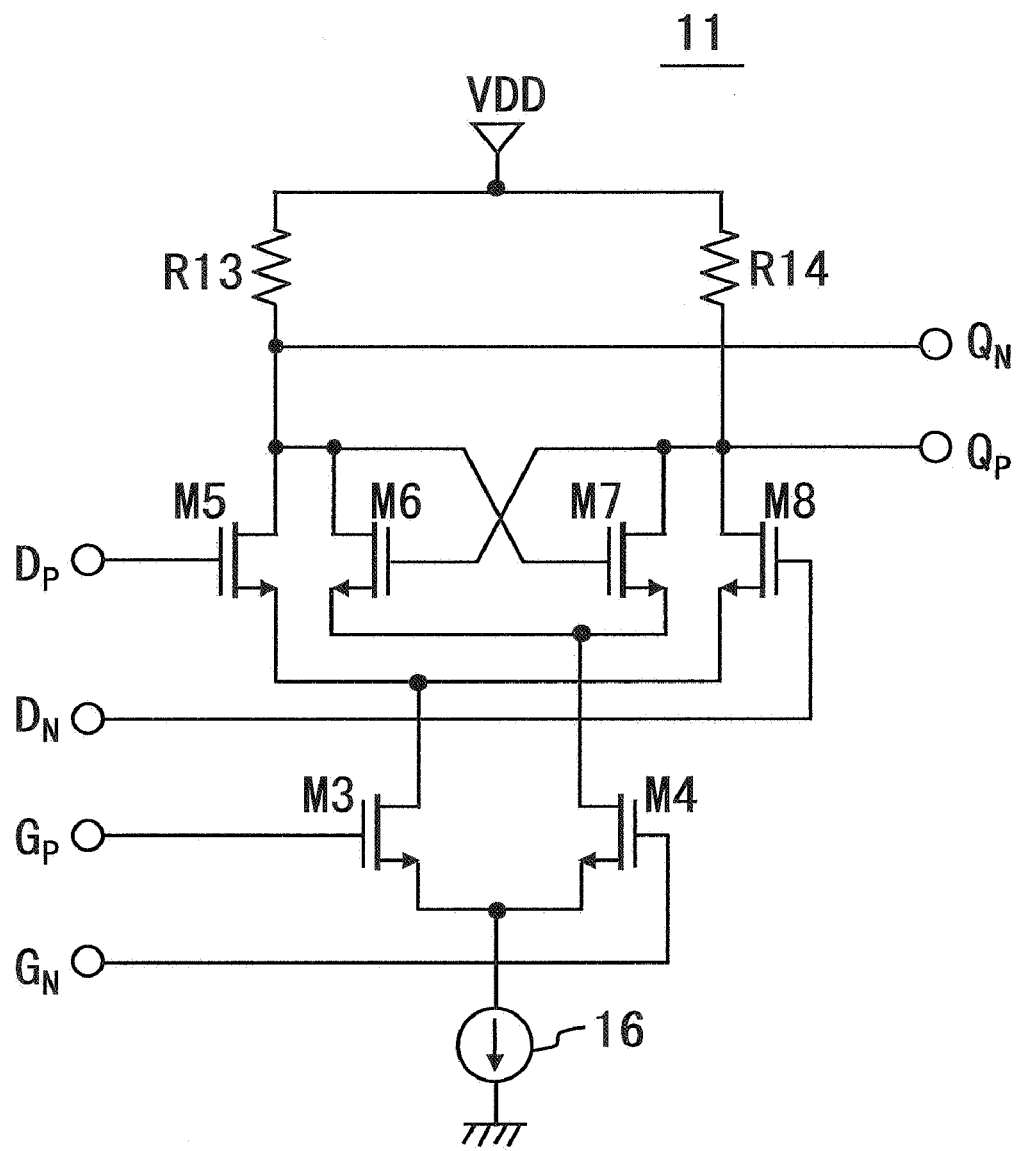
FIG. 3 shows a configuration example of a D latch of the phase shifter of the first embodiment.

The master D latch 11 and the slave D latch 12 can be realized with various circuit configurations. FIG. 3 shows a circuit configuration example of the master D latch 11. Incidentally, the slave D latch 12 can be configured similar to the master D latch 11. The master D latch 11 of FIG. 3 is composed of n-channel MOS transistors M3 to M8, resistors R13 and R14, and a constant current circuit 16.

To be specific, the gates of the transistors M3 and M4 are connected to the G input ($G_P$) terminal and the inverting G input ($G_N$) terminal, respectively. The sources of the transistors M3 and M4 are connected in common with the constant current circuit 16 and grounded through the constant current circuit 16. The drain of the transistor M3 is connected to the sources of the transistors M5 and M8 as a differential pair. The drain of the transistor M4 is connected to sources of the transistors M6 and M7.

The gates of the transistors M5 and M8 are connected to the D input ($D_P$) terminal and the inverting D input (DN) terminal, respectively. The drains of the transistors M5 and M6 are connected to a power supply VDD through the resistor R13, and to the base of the transistor M7. Further, the drains of the transistors M5 and M6 are connected to an inverting Q output ($Q_N$) terminal. The drains of the transistors M7 and M8 are connected to the power supply VDD through the resistor R14 and to the base of the transistor M6. Further, the drains of the transistors M7 and M8 are connected to the Q output ($Q_P$) terminal.

Figure 4:
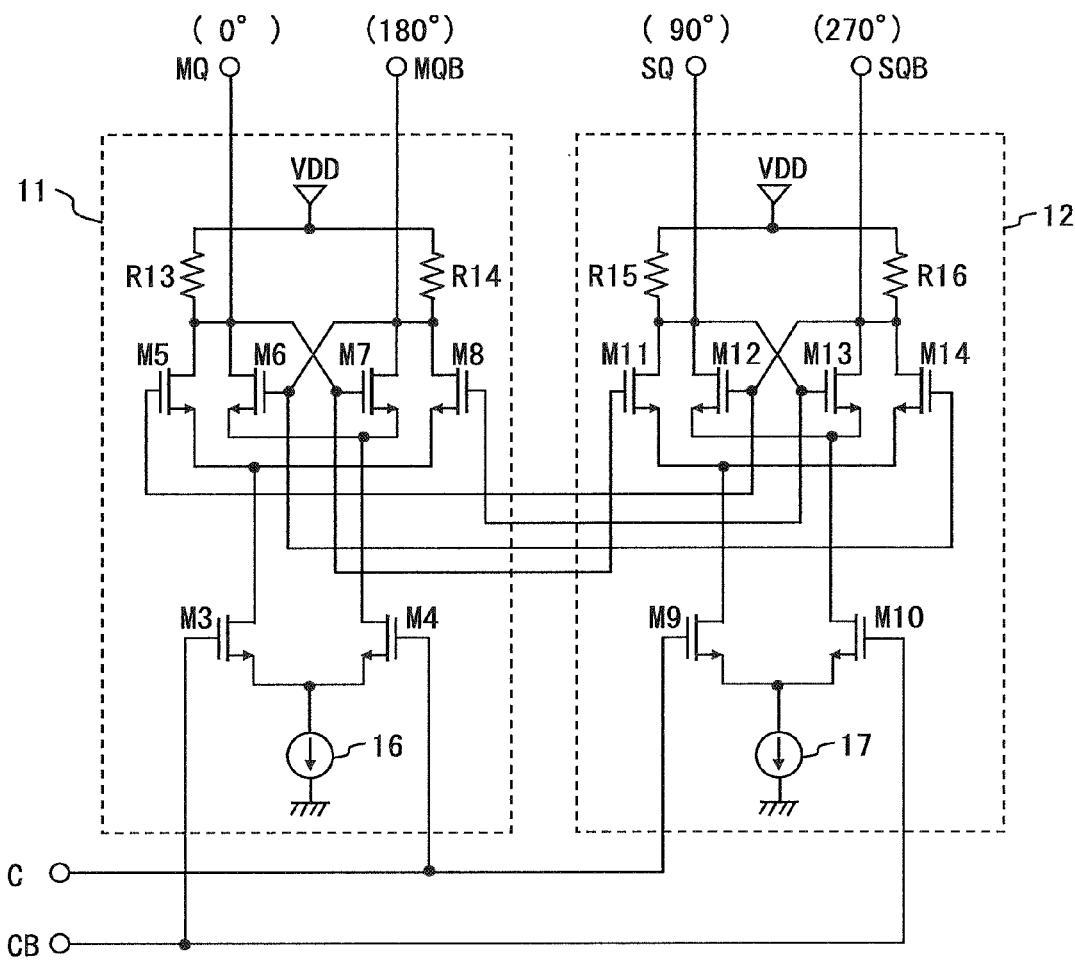
FIG. 4 shows a configuration example of a dividing circuit of the phase shifter of the first embodiment.

FIG. 4 shows a circuit configuration example of the dividing circuit 10 includes the master D latch 11 of FIG. 3 and the slave D latch 12 having the same configuration as the D latch 11. To be specific, the drains of the transistors M5 and M6 constituting the master D latch 11 are connected to a gate of the transistor M11 constituting the slave D latch 12. The drains of the transistors M7 and M8 constituting the master D latch 11 are connected to a gate of the transistor M14 constituting the slave D latch 12. Further, the drains of the transistors M13 and M14 constituting the slave D latch 12 are connected to a gate of the transistor M5 constituting the master D latch 11, and the drains of the transistors M11 and M12 are connected to a gate of the transistor M8.

Figure 2:
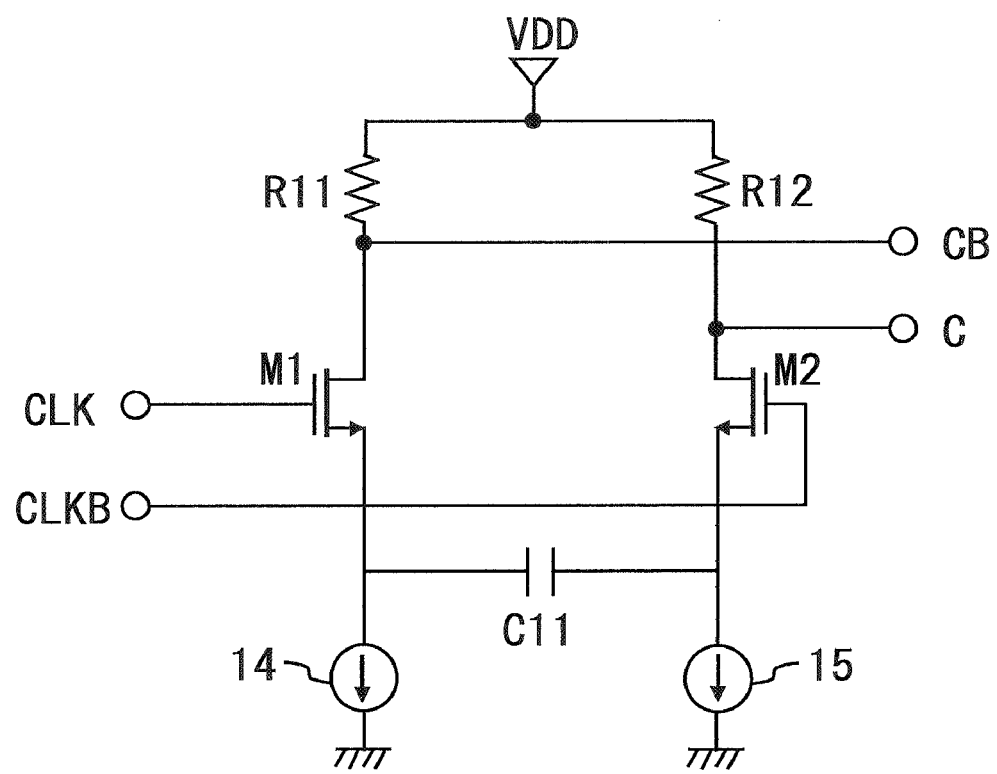
FIG. 2 shows a configuration example of a high-pass filter of the phase shifter of the first embodiment.

Referring back to FIG. 1, the HPF 13 receives the clock signal CLK and inverted clock signal CLKB, and attenuates low-frequency components in the clock signals CLK and CLKB to output the signals C and CB. The HPF 13 attenuating low-frequency components of the signals CLK and CLKB as differential signals can be configured as a differential circuit. FIG. 2 shows a schematic circuit configuration example.

The HPF 13 of FIG. 2 is composed of N-channel MOS transistors M1 and M2 as a differential pair, resistors R11 and R12, a capacitor C11, and constant current circuits 14 and 16. To be specific, gates of the transistors M1 and M2 are connected to input terminals of the clock signal CLK and inverted clock signal CLKB, respectively. Sources of the transistors M1 and M2 are grounded through the constant current circuits 14 and 15, respectively. Further, a source of the transistor M1 is connected to one end of the capacitor C1, and a source of the transistor M2 is connected to the other end of the capacitor C11. Drains of the transistor M1 and M2 are connected to the power supply VDD through the resistors R11 and R12, and connected to output terminals of the output signals C and CB.

The HPF 13 of this embodiment is intended not only to remove DC components of the input clock signals CLK and CLKB. That is, the HPF 13 amplifies AC components of the clock signals CLK and CLKB in a frequency range where signal intensity is changed due to a deterioration of duty ratios of the input signals CLK and CLKB, Thus, a feature of the HPF 13 is that a cutoff frequency of the HPF 13 is set higher than that of DC-cut capacitors C1 and C2 of the phase shifter 8 of the related art of FIG. 13. A detailed relation between the frequency characteristic of the HPF 13 and the output waveform of the phase shifter 1 is described below.

Figure 5A:
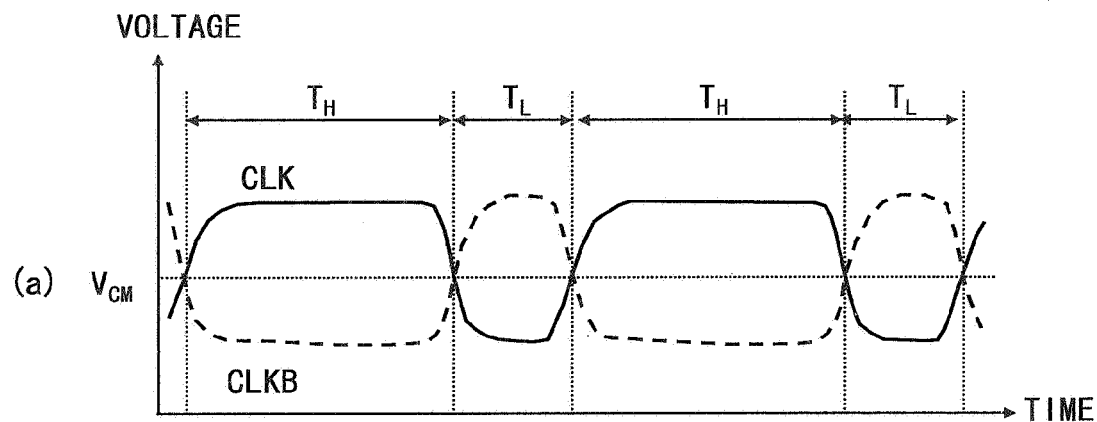
FIGS. 5A and 5B are signal waveform diagrams for explaining the principle of adjusting a phase difference between output signals with the phase shifter of the first embodiment.
Figure 5B:
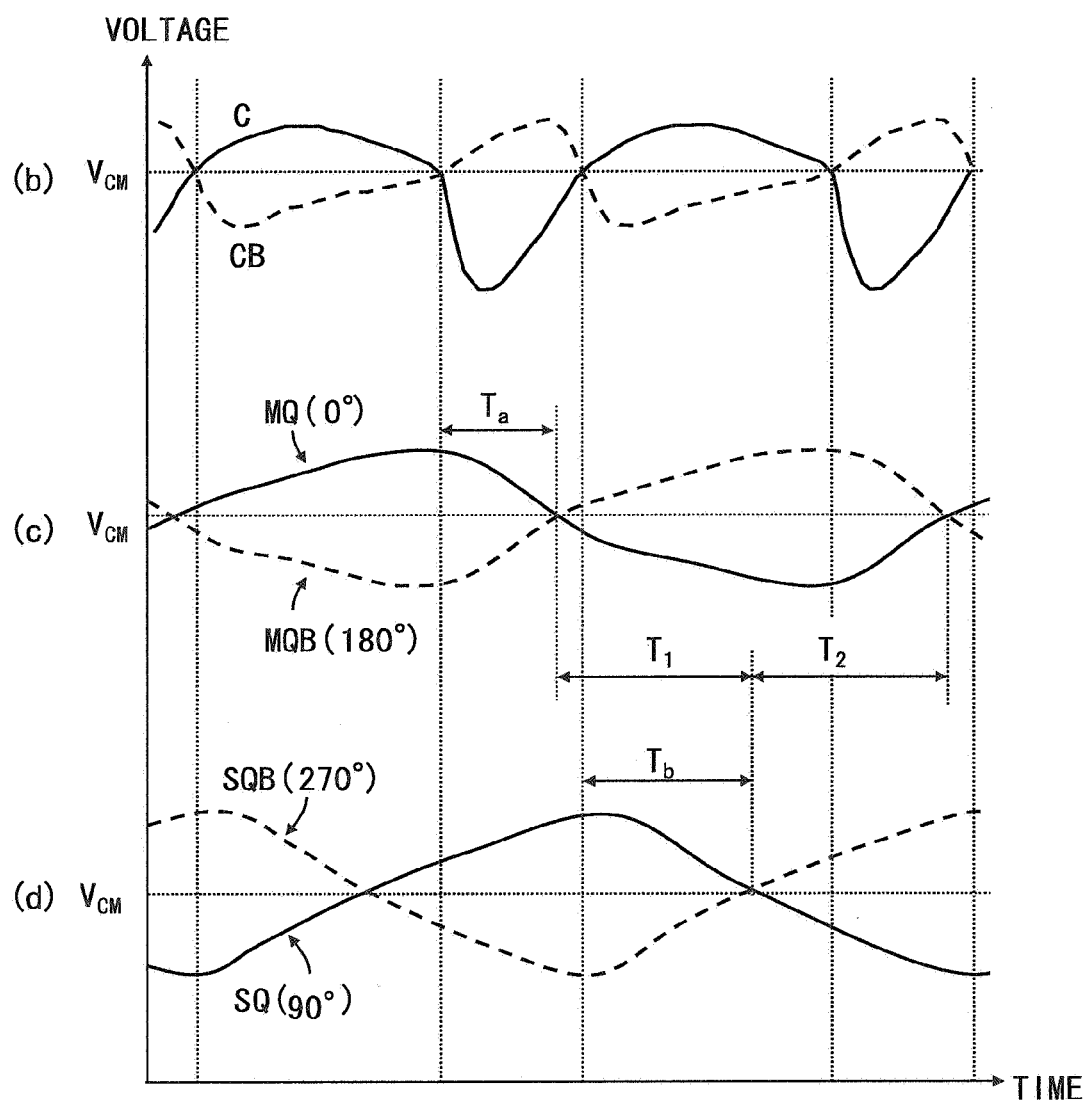

Referring next to the signal waveform diagram of FIGS. 5A and 5B, operations of the phase shifter 1 are described. The waveform (a) of FIG. 5A is an example of the waveform of the clock signals CLK and CLKB input to the phase shifter 1, that is, input to the HPF 13. The solid line of the waveform (a) represents the clock signal CLK, and the broken line represents the inverted clock signal CLKB. In this example, the High-level width $T_H$ Of the clock signal CLK is wider than that of the Low-level width $T_L$, and a duty ratio differs from 50%.

A waveform (b) of FIG. 5B is a waveform of the output signals C and CB obtained by inputting the clock signal CLK and inverted clock signal having the waveform (a) of FIG. 5A to the HPF 13. The waveform (b) has a feature that an amplitude in a period with a long time length of the clock signals CLK and CLKB is attenuated more largely than an amplitude in a period with a short time length. For example, focusing on the clock signal CLK, an amplitude in a High-level period with a long time length (the High-level width $T_H$) is attenuated more largely than an amplitude in a Low-level period with a short time length (the Low-level width $T_L$).

That is, the HPF 13 of the phase shifter 1 functions to deform the clock signals CLK and CLKB such that attenuation quantities of signal amplitudes in a period with a long time length of the clock signals CLK and CLKB are larger than attenuation quantities of signal amplitudes in a period with a short time length of the differential clock signals CLK and CLKB.

A period with a long time length of the clock signals CLK and CLKB includes more low-frequency components than a period with a short time length. To be specific, a cutoff frequency of the HPF 13 may be set higher to attenuate not only the DC components but also low-frequency components in a period with a long time length.

A waveform (c) and waveform (d) of FIG. 5B indicate output waveforms of 4-phase signals obtained by inputting the signals C and CB having the waveform (b) of FIG. 5B to the dividing circuit 10. The solid line of the waveform (c) represents a 0-degree signal output to the terminal MQ, and the broken line of the waveform (c) represents a 180-degree signal output to the terminal MQB. Further, the solid line of the waveform (d) represents a 90-degree signal output to the terminal SQ, and the broken line of the waveform (d) represents a 270-degree signal output to the terminal SQB.

As apparent from the waveforms (c) and (d) of FIG. 5B, there is a difference between the delay time Ta and delay time Tb, and the delay time Tb is longer than the time Ta. Here, the delay time Ta is a delay time from a crosspoint between the clock signals C and CB on the falling edge of the clock signal C to a crosspoint between the 0-degree signal and 180-degree signal on the falling edge of the 0-degree signal. On the other hand, the delay time Tb is a delay time from a crosspoint between the clock signals C and CB on the rising edge of the clock signal C to a crosspoint between the 90-degree signal and 270-degree signal on the falling edge of the 90-degree signal.

If there is a difference between the delay time Ta and delay time Tb as described above, a phase difference between the 0-degree signal and 90-degree signal, and a phase difference between the 180-degree signal and 270-degree signal increase, while a phase difference between the 90-degree signal and 180-degree signal and a phase difference between the 270-degree signal and 0-degree signal are decreased in inverse proportion thereto. That is, the HPF 13 deforms the clock signals CLK and CLKB such that a signal amplitude in a period with a long time length of the clock signals CLK and CLK is attenuated more largely than a signal amplitude in a period with a short time length of the differential clock signal to thereby cancel out deterioration of duty ratios of the signals CLK and CLKB to approximate a phase difference of the 4-phase signals to 90 degrees. To exactly adjust a phase difference to 90 degrees, the frequency characteristics of the HPF 13 are determined such that time differences T1 and T2 between zero-crosspoints are equal to each other.

Here, the principle of changing a phase difference between output signals brought by deforming the clock signals CLK and CLKB with the HPF 13 to is described. Output voltages of the Q output during sampling operations and hold operations of the master D latch 11 constituting the dividing circuit 10 can be approximated as a function of time based on Expressions (1) and (2).

$$V_{OUT}(t) \cong V_{IN}(t) \cdot \frac{g_m}{C_{OUT}} \cdot t + V_{OUT}(0), \quad g_m \propto V_{CB}(t) \tag{1}$$

$$V_{OUT}(t) \cong V_{OUT}(0) \cdot \exp\left(\frac{g_m}{C_{OUT}} \cdot t\right), \quad g_m \propto V_C(t) \tag{2}$$

In Expression (1) representing the output voltage $V_{OUT}$ during sampling operations, the end time t of the hold operations is set to 0. On the other hand, in Expression (2) representing the output voltage $V_{OUT}$ during hold operations, the end time t of sampling operations is set to 0. In Expressions (1) and (2), $g_m$ represents a mutual conductance of the transistors M5 to M8, $C_{OUT}$ represents the total sum of a gate capacitance of the transistors M5 to M8 and a capacitance at the output terminal of the D latch 11. In Expression (1), $V_{IN}(t)$ represents an input voltage to the D input ($D_P$) of the master D latch 11 at the time t. In Expression (1), $V_{CB}(t)$ represents a voltage of the clock signal CB at the time t. Further, in Expression (2), $V_C(t)$ represents a voltage of the clock signal C at the time t.

An output voltage of the Q output during the sampling operations and hold operations of the slave D latch 12 can be expressed similar to the master D latch 11. To be specific, the output voltage during sampling operations can be expressed by Expression (3), and the output voltage during hold operations can be expressed by Expression (4).

$$V_{OUT}(t) \cong V_{IN}(t) \cdot \frac{g_m}{C_{OUT}} \cdot t + V_{OUT}(0), \quad g_m \propto V_C(t) \tag{3}$$

$$V_{OUT}(t) \cong V_{OUT}(0) \cdot \exp\left(\frac{g_m}{C_{OUT}} \cdot t\right), \quad g_m \propto V_{CB}(t) \tag{4}$$

As apparent from Expression (1), the transition time Ta of the output voltage $V_{OUT}$ at the time when the master D latch 11 is shifted to sampling operation on the falling edge of the clock signal C (rising edge of the clock signal CB) depends on the mutual conductance $g_m$, and the mutual conductance $g_m$ is proportional to the voltage $V_{CB}$ of the clock signal CB.

On the other hand, as apparent from Expression (3), the transition time Tb of the output voltage $V_{OUT}$ at the time when the slave D latch 12 is shifted to sampling operations on the rising edge of the clock signal C (falling edge of the clock signal CB) depends on the mutual conductance $g_m$, and the mutual conductance $g_m$ is proportional to the voltage $V_C$ of the clock signal C.

That is, the transition time Ta of the output voltage of the master D latch 11 and the transition time Tb of the output voltage of the slave D latch 12 can be changed in accordance with a voltage of the clock signal during the sampling operations.

The phase shifter 1 of this embodiment uses the HPF 13 to deform the clock signals CLK and CLKB such that a signal amplitude in a period with a long time length of the clock signals CLK and CLKB, that is, a period including more lower-frequency components is attenuated more largely than a signal amplitude in a period with a short time length of the differential clock signal. Since the amplitude in a period with a long time length is relatively low, the mutual conductance $g_m$ in this period is smaller than that of the period with a short time length. Hence, a transition time of the output voltage $V_{OUT}$ of the clock signals CLK and CLKB in a period with a long time length is longer than the transition time in a period with a short time length. That is, in the waveform diagram of FIG. 5B, the transition time Tb in the period with a long time length $T_H$ can be longer than the transition time Ta in the period with a short time length $T_L$.

As described above, the phase shifter 1 of this embodiment deforms the clock signal CLK with the HPF 13 and then inputs the deformed signal to the dividing circuit 10. Hence, if a duty ratio of the clock signal CLK differs from 50%, a transition time difference is set between output signals of the two D latches 11 and 12 to thereby adjust a phase difference between output signals. Thus, if a duty ratio differs from 50%, the clock signals CLK and CLKB have a waveform similar to rectangular waveform, and it is difficult to adjust a phase of an output signal with the phase shifter 8 of the related art, the phase shifter 1 can adjust a phase difference between output signals to 90 degrees.

Figure 6A:
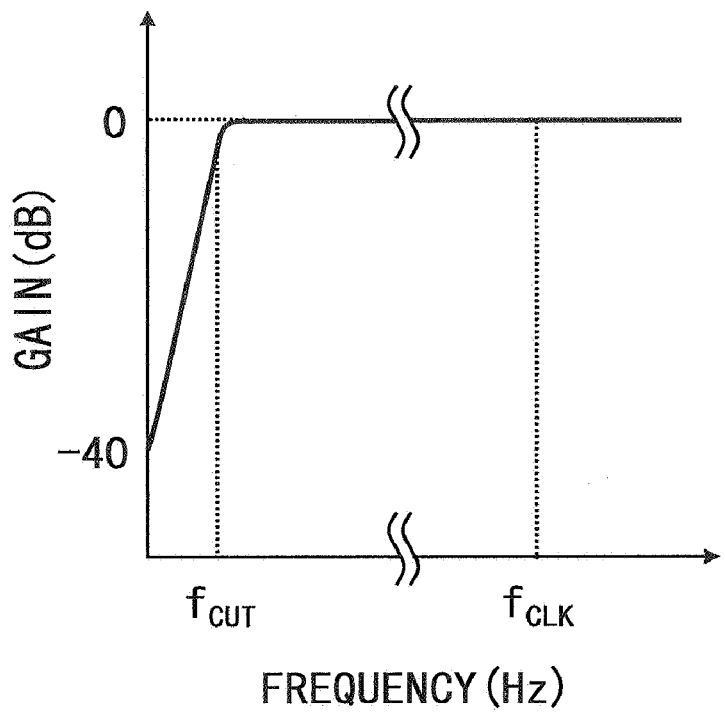
FIGS. 6A and 6B show gain slope characteristics of a high-pass filter of the phase shifter of the first embodiment.
Figure 13:
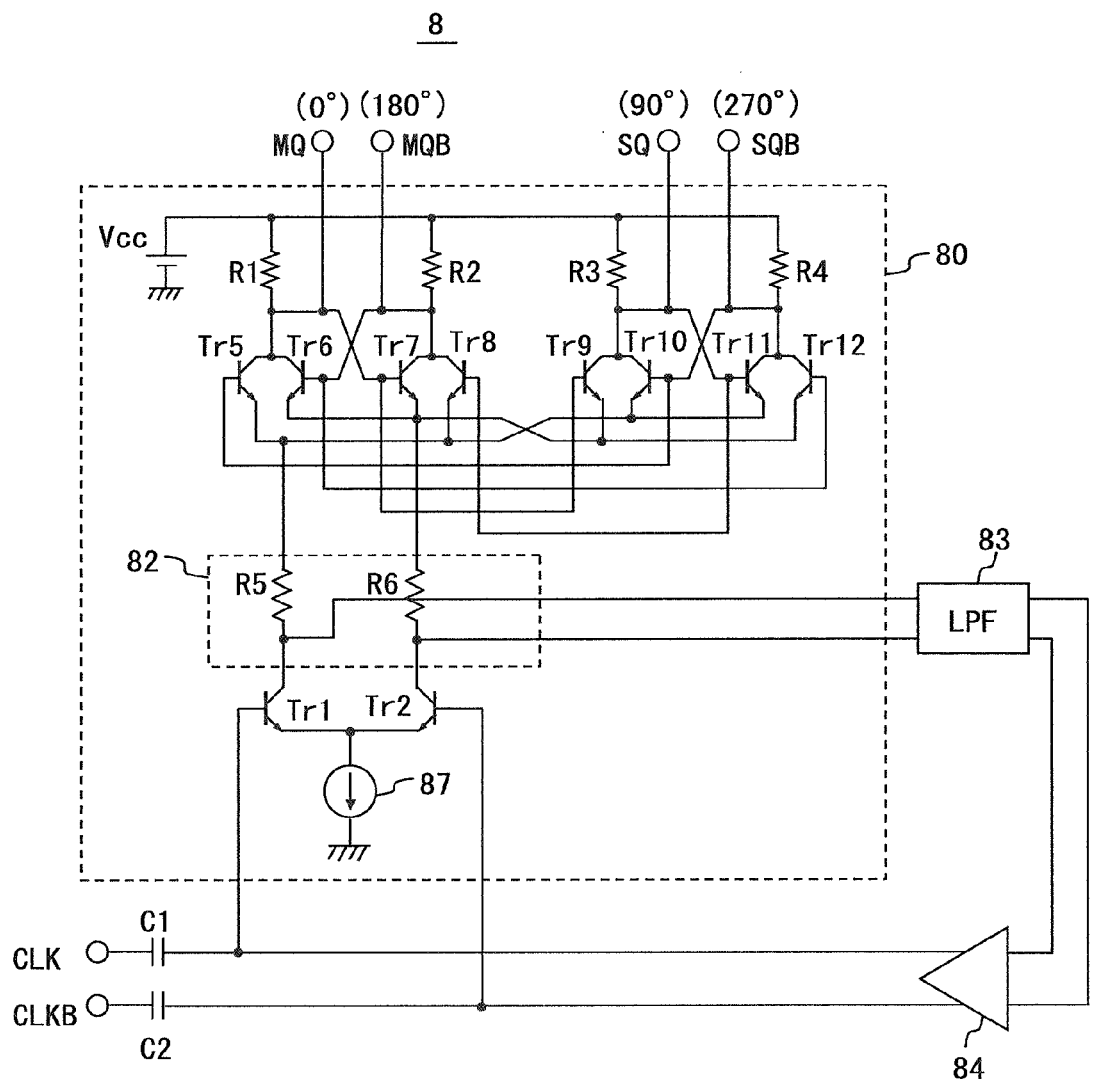
FIG. 13 is a diagram of a phase shifter of the related art.
Figure 14A:
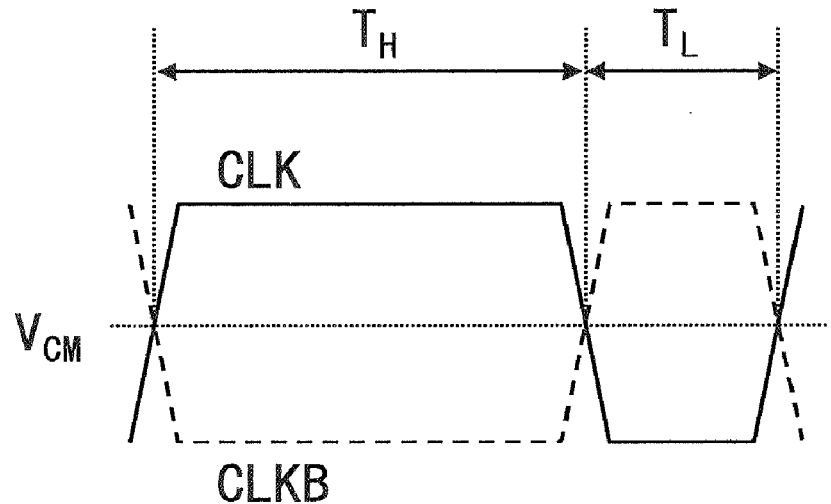
FIGS. 14A and 14B are waveform diagrams for explaining problems of the phase shifter of the related art.
Figure 14B:
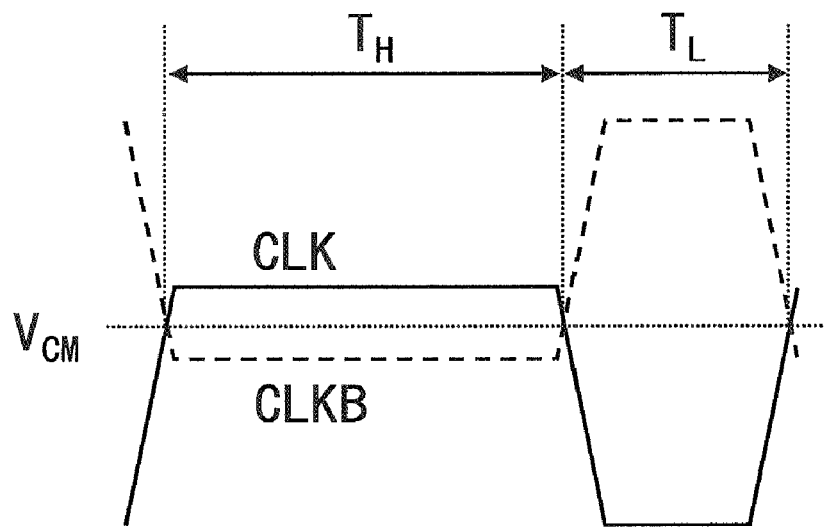

Incidentally, the DC-cut capacitors C1 and C2 of the phase shifter 8 of the related art as shown in FIG. 13 are intended to remove DC components of the input clock signals CLK and CLKB and suppress an influence on a previous circuit. To that end, the cutoff frequency of the DC-cut capacitors C1 and C2 is set to sufficiently low frequency, for example, 1.6 MHz or less if the input clock signal CLK has a frequency of about 3 GHz to remove DC components with a frequency of 0 Hz and not to deform a waveform of the DC-cut clock signal. FIG. 6A shows gain slope characteristics (attenuation characteristics) of the DC-cut capacitor. In FIG. 6A, $f_{CLK}$ represents a frequency of the input clock signal CLK, and $f_{CUT}$ represents a −3 dB cutoff frequency of the DC-cut capacitor.

Figure 6B:
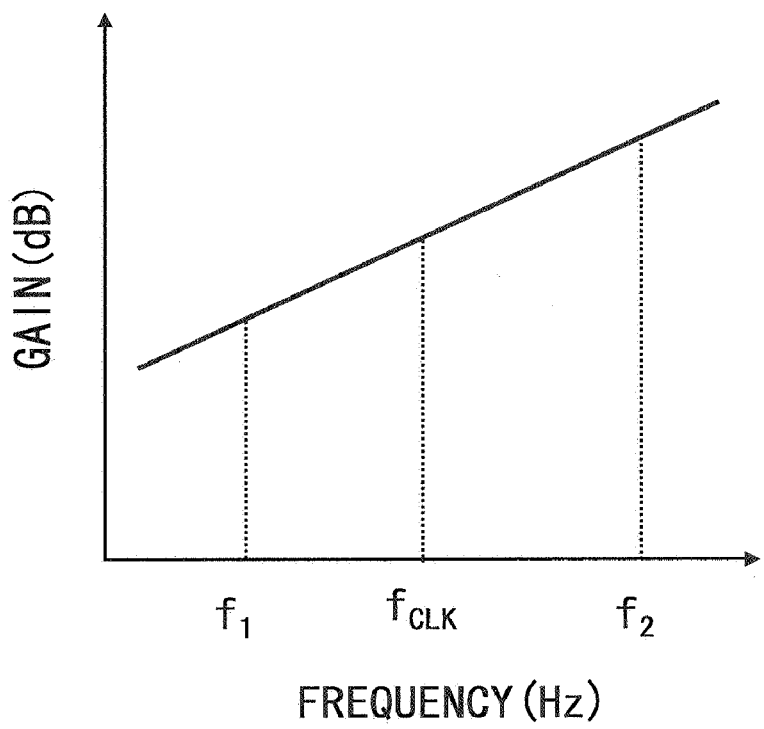

In contrast, the HPF 13 of the phase shifter 1 of this embodiment attenuates not only DC components of the clock signal CLK but also frequency components that forms a waveform in a period with the long time length of the clock signal CLK if a clock signal with a deteriorated duty ratio is input to thereby set a signal amplitude in a period with a long time length of the clock signal CLK more largely than a signal amplitude in a period with a short time length of the differential clock signal. That is, the HPF 13 is intended to deform the clock signal CLK by an amount corresponding to a difference between the High-level width and Low-level width of the clock signal. Therefore, gain slope characteristics (attenuation characteristics) of the HPF 13 are determined such that the HPF 13 not only cuts DC components of the clock signal CLK but also attenuate up to higher-frequency components that determines the waveform of the clock signal CLK. FIG. 6B shows gain slope characteristics (attenuation characteristics) of the HPF 13. In FIG. 6B, $f_{CLK}$ represents a frequency of the input clock signal CLK. Further, $f_1$ and $f_2$ are derived from Expressions (5) and (6) below.

$$f_1 = \frac{1}{xUI*2} f_{CLK}, \quad 0.5 < xUI < 1 \quad (5)$$

$$f_2 = \frac{1}{(1-xUI)*2} f_{CLK}, \quad 0.5 < xUI < 1 \quad (6)$$

In Expressions (5) and (6), xUI represents a time length of the input clock signal CLK in a period with a long time length with a period of the input clock signal CLK used as a unit interval (UI) The minimum value of $f_1$ is $\frac{1}{2}f_{CLK}$, and the maximum value of $f_1$ is $f_{CLK}$. Further, the minimum value of $f_2$ is $f_{CLK}$, and the maximum value of $f_2$ is infinite. As shown in FIG. 6B, the gain slope characteristics of the HPF 13 (attenuation characteristics) are determined such that the frequency $f_{CLK}$ of the input clock signal CLK is obtained in a frequency domain having a gain slope that represents an ever-increasing gain along with an increase in frequency, that is, positive gain slope.

The DC-cut capacitors C1 and C2 of the phase shifter 8 of the related art as shown in FIG. 13 and the HPF 13 of the phase shifter 1 of this embodiment largely differ from each other in frequency characteristic as well as functions.

Figure 7A:
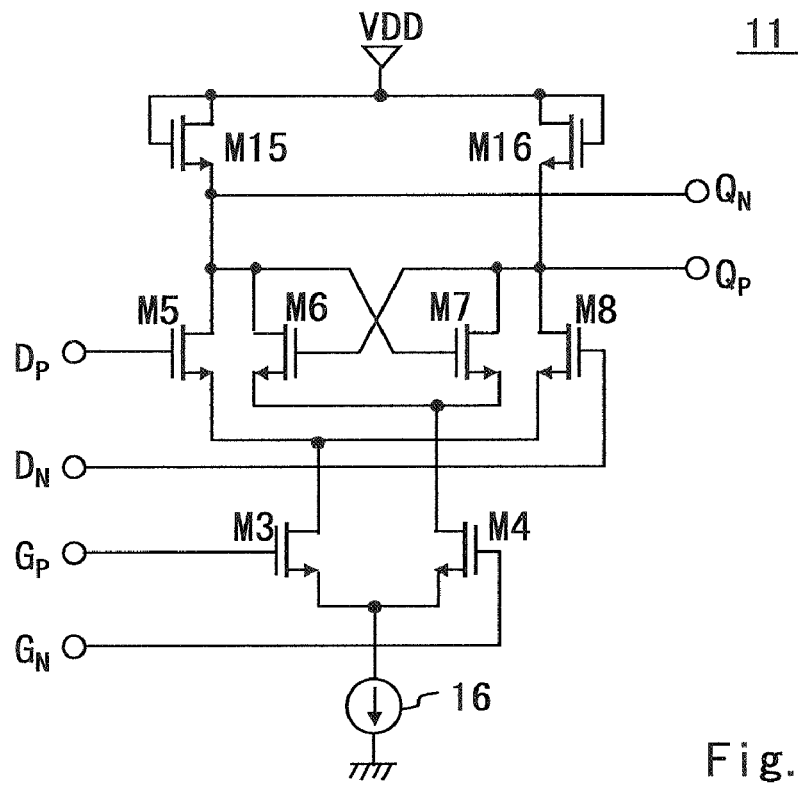
FIGS. 7A to 7C show a configuration example of the D latch of the phase shifter of the first embodiment.
Figure 7B:
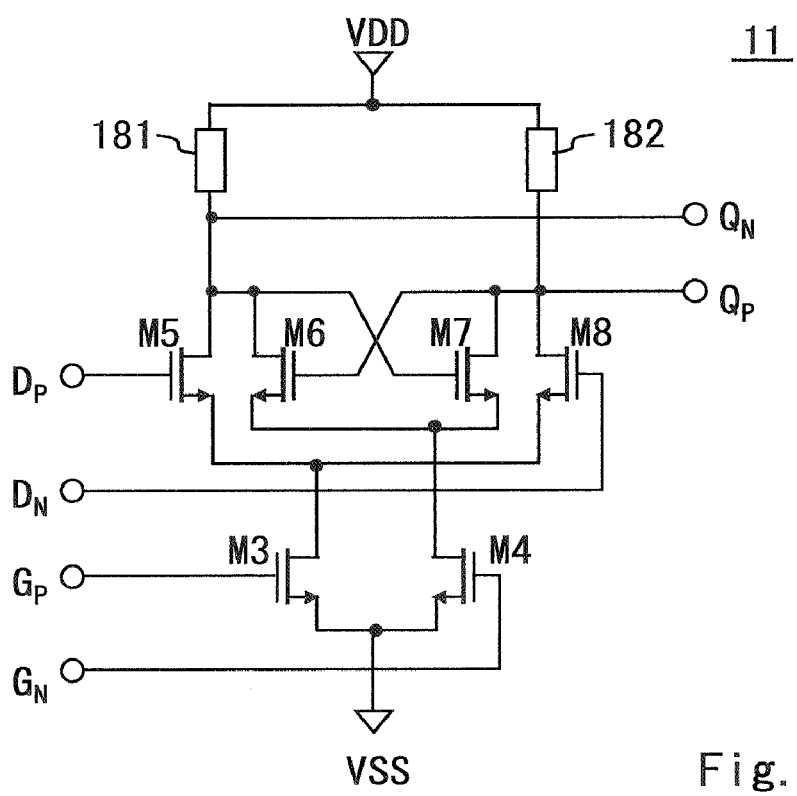
Figure 7C:
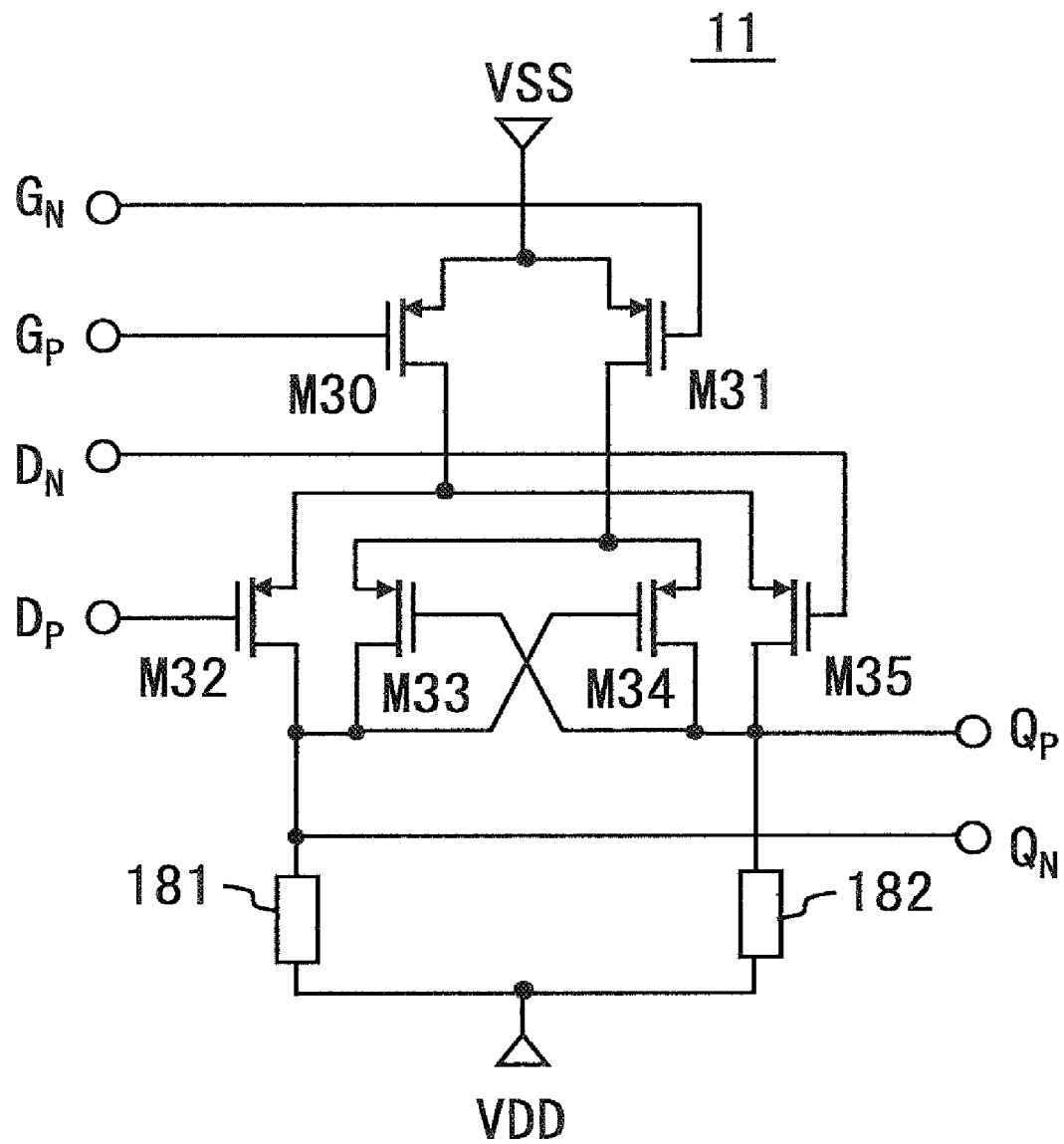
Figure 11:
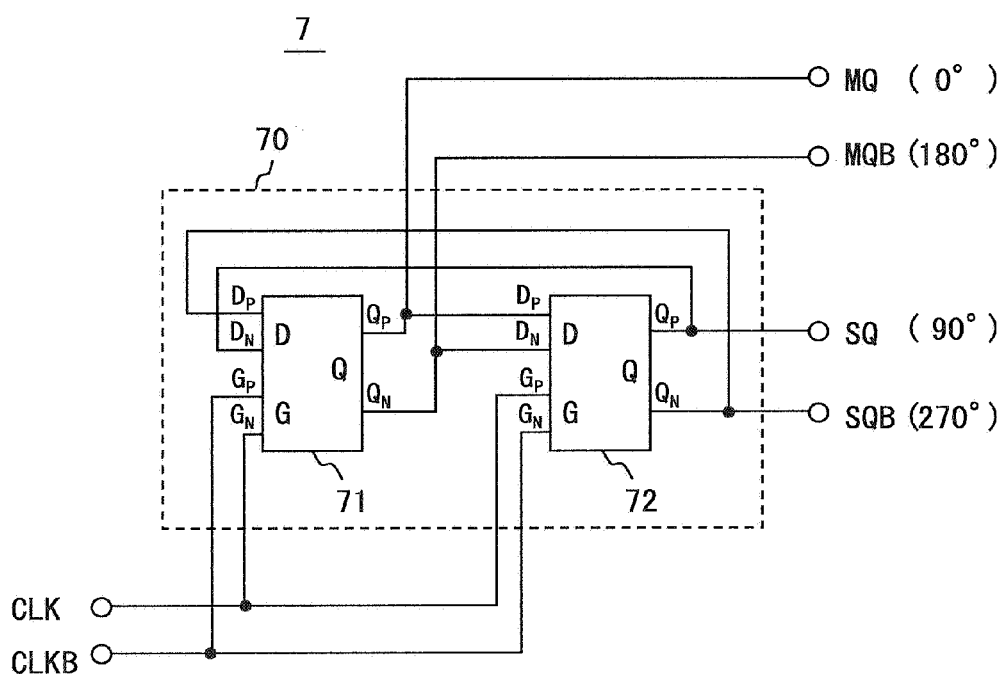
FIG. 11 is a diagram of the phase shifter of the related art.
Figure 12:
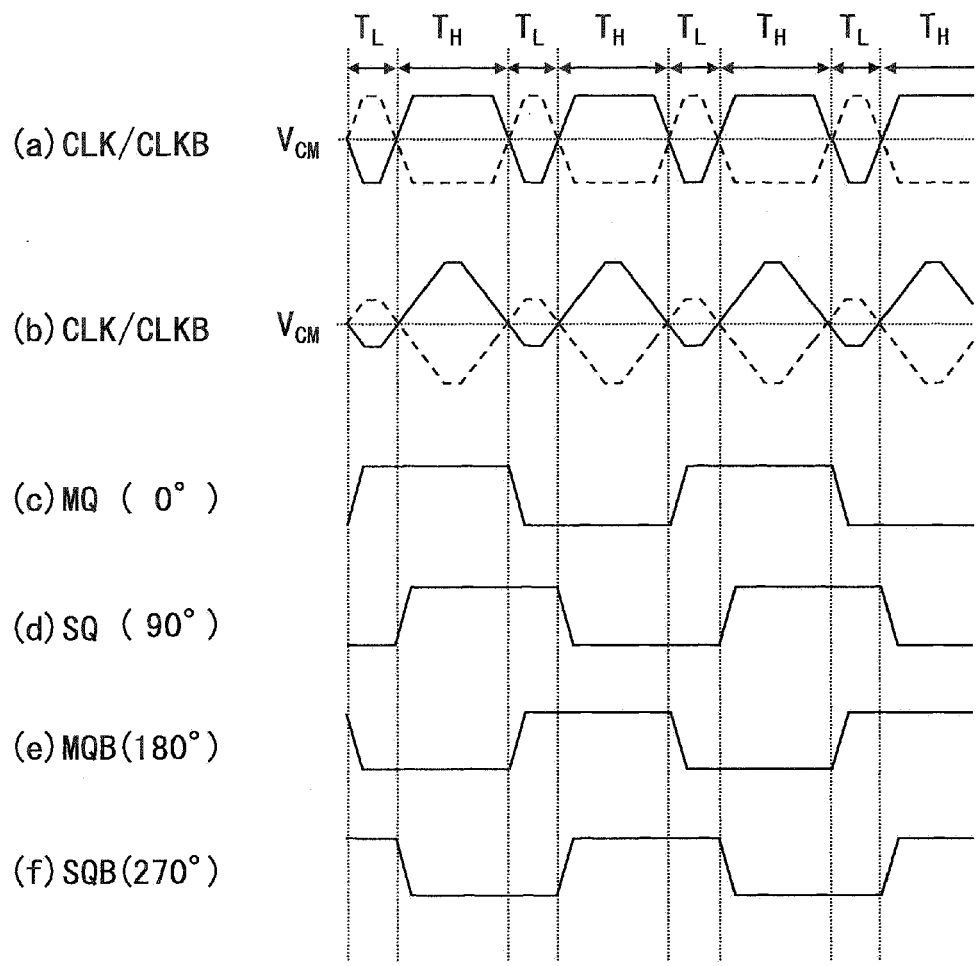
FIG. 12 is a waveform diagram for explaining a relation between a duty ratio of the input clock signal and a phase difference between output signals.

The detailed circuit configuration example of the D latches 11 and 12 of the phase shifter 1 of this embodiment is shown in FIG. 3; needless to say, the example is described for illustrative purposes. Functions of the D latches 11 and 12 that realize the dividing circuit 10 configured by the master-slave type T-flipflop can be executed by various circuit configurations. For example, in the D latch 11, the resistors R13 and R14 may be replaced by the other resistive loads. To be specific, as shown in FIG. 7A, the resistors may be replaced by MOS transistors operating in a saturation region where the gate and the drain are short-circuited. Further, as shown in FIG. 7B, the current source circuit 16 may be omitted. Further, as shown in FIG. 7C, in place of the N-channel MOS transistors, P-channel MOS transistors M30 to M35 comple-mentary thereto may be used. Further, in place of the MOS transistors, bipolar transistors may be used as in the dividing circuit 80 of FIG. 11.

Figure 8A:
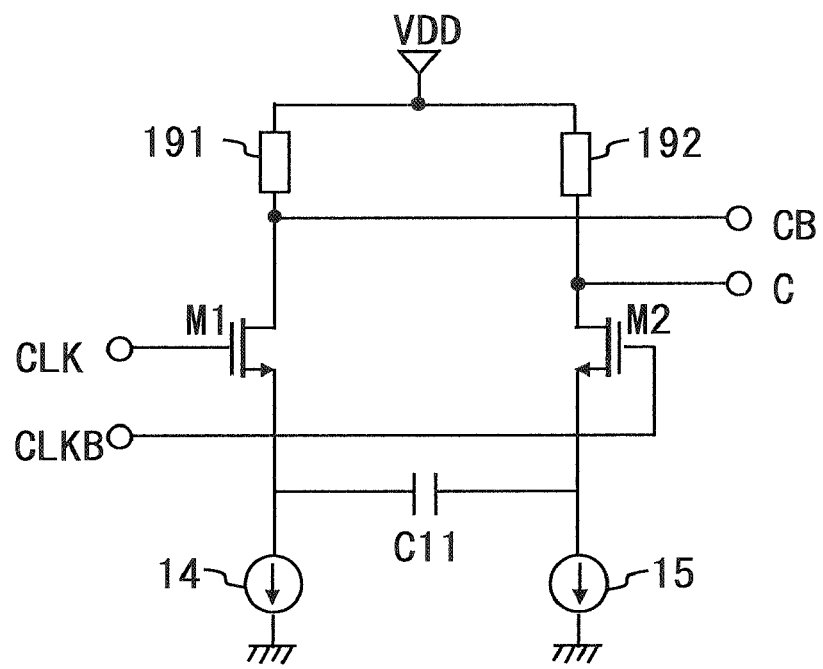
FIGS. 8A and 8B show a configuration example of the high-pass filter of the phase shifter of the first embodiment.
Figure 8B:
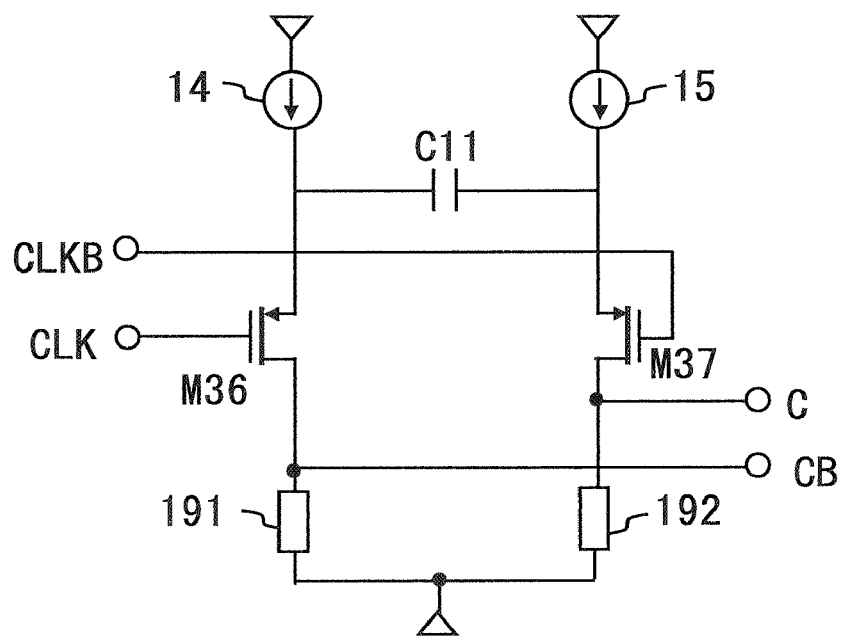

Likewise, the configuration of the HPF 13 of the phase shifter 1 as shown in FIG. 2 is described by way of example, and functions of the HPF 13 described in this embodiment can be executed by various circuit configurations. For example, as shown in FIG. 8A, the resistors R11 and R12 may be replaced by the other resistive loads 191 and 192. Further, as shown in FIG. 8B, in place of the N-channel MOS transistors, P-channel MOS transistors M36 and M37 complementary thereto may be used.

Second Embodiment

Figure 9:
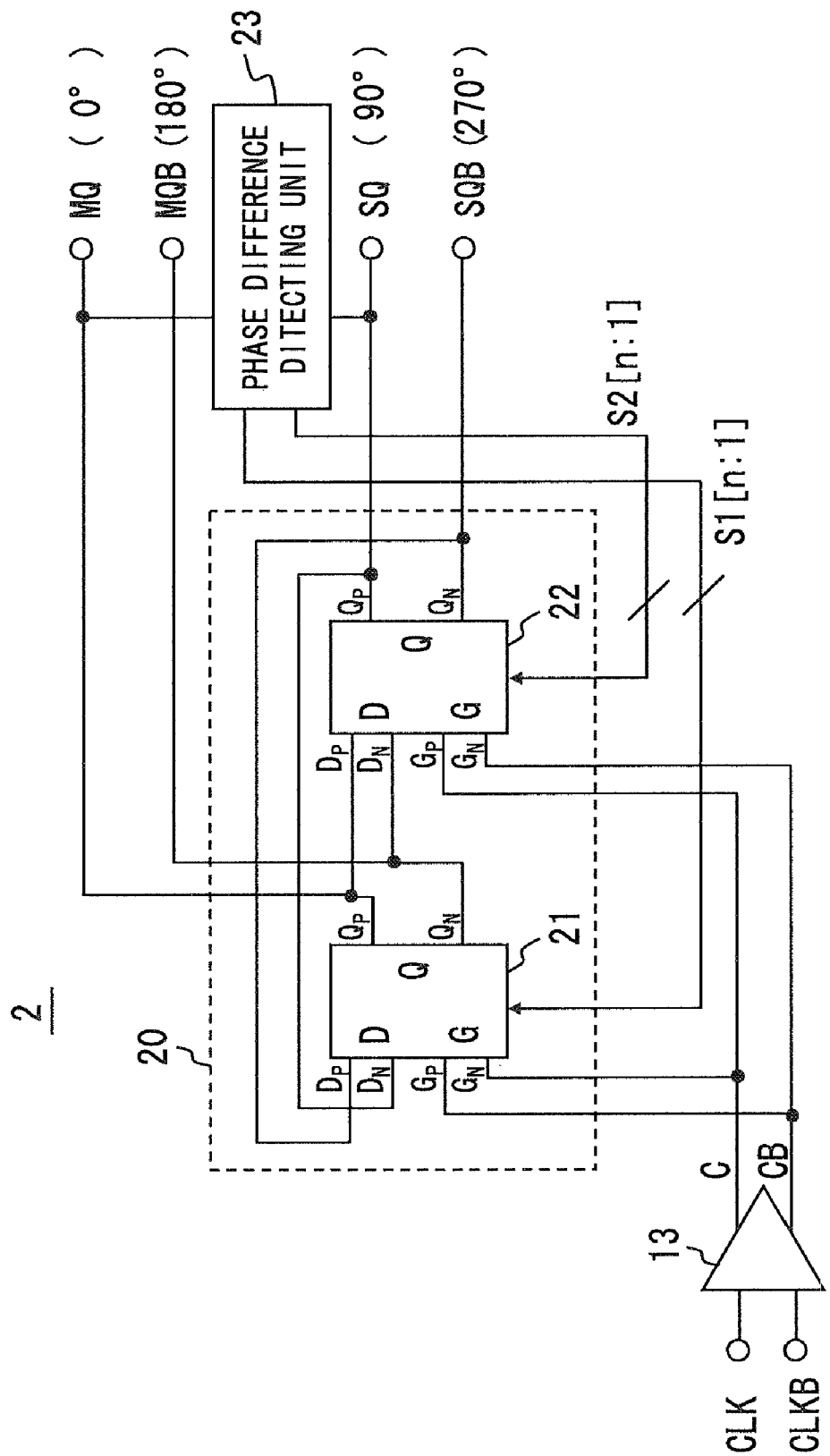
FIG. 9 is a diagram of a phase shifter according to a second embodiment of the present invention.

FIG. 9 shows the configuration of a phase shifter 2 of this embodiment. In FIG. 9, the dividing circuit 20 is a T-flip-flop type dividing circuit composed of a master D latches 21 and slave D latch 22 connected in tandem. The basic configuration of the dividing circuit 20 is the same as that of the dividing circuit 10 of the first embodiment. However, the master D latch 21 and slave D latch 22 include a variable capacitor with a variable capacitance function at output terminals.

A phase difference detecting circuit 23 detects a shift of a phase difference between the 0-degree signal output to the terminal MQ and the 90-degree signal output to the terminal SQ from 90 degrees. Further, the phase difference detecting circuit 23 outputs control signals S1 and S2 for changing a capacitance of the variable capacitor of the master D latch 21 and slave D latch 22 in accordance with the detected shift of the phase difference. Incidentally, in this embodiment, the control signals S1 and S are n-bit signals.

Figure 10:
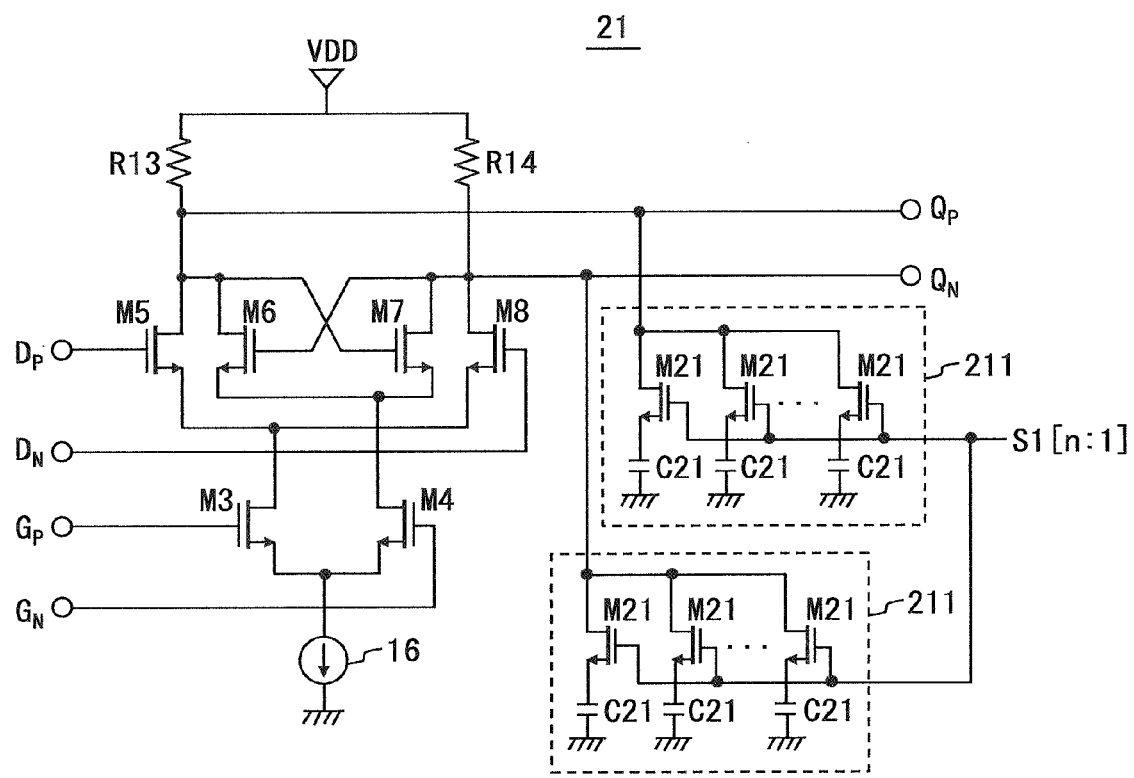
FIG. 10 shows a configuration example of a D latch of the phase shifter of the second embodiment.

FIG. 10 shows a configuration example of the master D latch 21. In FIG. 10, the basic configuration of the D latch composed of the transistors M3 to M5, the resistors R13 and R14, and the constant power circuit 16 is the same as that of the master D latch 11 as shown in FIG. 3. IN the master D latch 21, variable capacitors 211 are connected to drains of the transistors M5 and M6 connected in common and drains of the transistors M7 and M8 connected in common, respectively.

The variable capacitor 211 can change a capacitance in accordance with a combination of bit value of the control signal S1. In the configuration of FIG. 10, the variable capacitor 211 includes n capacitors C21 each having one end connected to the transistor M21 operating as a switching element and the other end grounded. Further, then capacitors C21 are connected in parallel. In such configuration, the transistors M21 are turned ON/OFF under the control in accordance with the bit value (1 or 0) of the control signal S1 to thereby adjust a capacitance of the variable capacitor 211 in (n+1) stages. Incidentally, the slave D latch 22 is configured similar to the master D latch 21, and a capacitance can be changed with the n-bit control signal S2.

The capacitance of the variable capacitor 211 connected to output terminals of the D latches 21 and 22 is changed to thereby adjust the capacitance $C_{out}$ in Expressions (1) to (4) above. As apparent from Expressions (1) and (3), the transition time Ta and transition time Tb of the output voltage $V_{OUT}$ depends on the capacitance $C_{out}$ as well as the mutual conductance $g_m$. Therefore, a capacitance of the variable capacitor 211 is changed in accordance with the shift of a phase difference between output signals from 90 degrees detected with the a phase difference detecting circuit 23 to thereby change a difference between the transition time Ta and transition time Tb of the output voltage $V_{OUT}$. As a result, even if the clock duty ratio of the signals CLK and CLKB varies, a difference between the transition time Ta and transition time Tb of the output voltage $V_{OUT}$ is adjusted to keep a phase difference between output signals to 90 degrees.

Other Embodiments

In the first and second embodiments, the HPF 13 is used as an AC component amplifying unit to deform the waveform of the input clock signals CLK and CLKB. However any AC component amplifying unit having the gain slope characteristics of FIG. 6B can be used. In fact, a circuit that applies a positive gain to the input signal may be used in place of the high-pass filter that attenuates the input signal, that is, applies a negative gain to the input signal. Such an AC component amplifying unit having the amplifying function can be readily realized with similar active filter of FIG. 2.

In the second embodiment, a capacitance of the variable capacitor 211 is changed in accordance with a phase difference between output signals detected with the phase difference detecting circuit 23. However, a frequency characteristic of the HPF 13, that is, cutoff frequency and slope characteristics may be changed in accordance with the phase difference between output signals detected with the phase difference detecting circuit 23. By changing the frequency characteristic of the HPF 13, the mutual conductance $g_m$ of the transistors constituting the D latches 11 and 12 or D latches 21 and 22 can be changed. Thus, even if the clock duty ratio of the signals CLK and CLKB is changed, a difference between the transition time Ta and transition time Tb of the output voltage $V_{OUT}$ is adjusted to keep a phase difference between output signals to 90 degrees.

It is apparent that the present invention is not limited to the above embodiments, but may be modified and changed without departing from the scope and spirit of the invention.

What is claimed is:

1. A phase shifter, comprising:
an AC component amplifying unit having positive gain slope characteristics and deforming a waveform of an input differential clock signal to output a deformed differential clock signal and amplifying AC components of the input differential clock signal in a frequency range where signal intensity is changed due to a deterioration of duty ratios of the input differential clock signal;
a dividing circuit including a T-flipflop having two D latches connected in series and receiving the deformed differential clock signal deformed by the AC component amplifying unit to generate at least two output signals having a phase difference of 90 degrees with a frequency of ½ of the deformed differential clock signal;
a detecting unit detecting a phase difference between the two output signals and outputting a control signal corresponding to the detected phase difference; and
a variable capacitor connected to an output line of at least one of the two output signals and capable of changing a capacitance in accordance with the control signal.

2. A phase shifter, comprising:
an AC component amplifying unit having positive gain slope characteristics and deforming a waveform of an input differential clock signal to output a deformed differential clock signal and amplifying AC components of the input differential clock signal in a frequency range where signal intensity is changed due to a deterioration of duty ratios of the input differential clock signal;
a dividing circuit including a T-flipflop having two D latches connected in series and receiving the deformed differential clock signal deformed by the AC component amplifying unit to generate at least two output signals having a phase difference of 90 degrees with a frequency of ½ of the deformed differential clock signal; and
a detecting unit detecting a phase difference between the two output signals and outputting a control signal corresponding to the detected phase difference,
wherein gain slope characteristics of the AC component amplifying unit can be changed in accordance with the control signal.

3. A phase shifter, comprising:
an AC component amplifying unit having positive gain slope characteristics and deforming a waveform of an input differential clock signal to output a deformed differential clock signal and amplifying AC components of the input differential clock signal in a frequency range where signal intensity is changed due to a deterioration of duty ratios of the input differential clock signal; and
a dividing circuit including a T-flipflop having two D latches connected in series and receiving the deformed differential clock signal deformed by the AC component amplifying unit to generate at least two output signals having a phase difference of 90 degrees with a frequency of ½ of the deformed differential clock signal,
wherein the AC component amplifying unit is configured to apply a gain to the input differential clock signal according to such gain slope characteristics that a gain increases along with an increase in frequency in at least one frequency range, the frequency range including a frequency of the input differential clock signal, and
wherein the AC component amplifying unit has gain slope characteristics wherein the gain in decibels increases linearly with an increase in frequency from a first frequency, f1, to a second frequency, f2, where f1 and f2 are determined according to following relationships:

f1=fclk*[1/(xUI*2)], f2=fclk*[1/((1−xUI)*2)], fclk<f2, 0.5fclk<f1<fclk, 0.5<xUI<1, where fclk is frequency of the input differential clock signal, UI is a unit interval equal to period of the input differential clock signal, xUI is a first time interval longer than a second time interval, and (1−xUI) is the second time interval.

* * * * *